(12) United States Patent
Srinivas et al.

(10) Patent No.: US 9,310,836 B2
(45) Date of Patent: Apr. 12, 2016

(54) RESIN-ENCAPSULATED PORTABLE MEDIA DEVICE

(71) Applicant: Amazon Technologies, Inc., Reno, NV (US)

(72) Inventors: Vikram Srinivas, San Jose, CA (US); Ali-Reza Bahmandar, San Jose, CA (US); Shankar Ganapathysubramanian, Cupertino, CA (US); Ramez Nachman, San Francisco, CA (US); Patrick Tang, Fremont, CA (US)

(73) Assignee: Amazon Technologies, Inc., Reno, NV (US)

( * ) Notice: Subject to any disclaimer, the term of this patent is extended or adjusted under 35 U.S.C. 154(b) by 315 days.

(21) Appl. No.: 13/886,075

(22) Filed: May 2, 2013

(65) Prior Publication Data
US 2014/0327624 A1    Nov. 6, 2014

(51) Int. Cl.
*G06F 3/041* (2006.01)
*G06F 1/16* (2006.01)

(52) U.S. Cl.
CPC ............ *G06F 1/1626* (2013.01); *G06F 1/1643* (2013.01); *G06F 1/1656* (2013.01); *Y10T 29/49117* (2015.01)

(58) Field of Classification Search
CPC ... G06F 1/1626; G06F 1/1643; G06F 1/1656; G06F 3/0412; Y10T 29/49117
USPC ........................................................ 345/173
See application file for complete search history.

(56) References Cited

U.S. PATENT DOCUMENTS

| | | | |
|---|---|---|---|
| 8,330,854 B2 | 12/2012 | Kossin | |
| 9,041,692 B2 * | 5/2015 | Nemoto | G06F 3/0412 345/175 |
| 9,176,527 B2 * | 11/2015 | Lee | G06F 1/1626 |
| 2005/0264986 A1 * | 12/2005 | Kee | G06F 1/1616 361/679.21 |
| 2009/0291532 A1 * | 11/2009 | Takase | B29C 43/18 438/127 |
| 2012/0235951 A1 | 9/2012 | Brown et al. | |
| 2013/0063873 A1 * | 3/2013 | Wodrich | G06F 1/1635 361/679.01 |

FOREIGN PATENT DOCUMENTS

WO    WO 2014/179304    11/2014

OTHER PUBLICATIONS

Appelgate, Michael. "Utah's HzO hopes to deliver waterproofing for gadgets by 2013." The Salt Lake Tribune. Feb. 11, 2013. 4 pp.
Azage et al. "Waterproof Cellular Phone Design." 22 pp.
"Low Density Epoxy Potting Compound." Epoxies Innovative Bonding Solutions Etc. Jul. 2012. 2 pp.
PCT International Search Report and Written Opinion dated Sep. 9, 2014, issued in Application No. PCT/US2014/035861.

* cited by examiner

*Primary Examiner* — Aneeta Yodichkas
*Assistant Examiner* — Chineyere Wills-Burns
(74) *Attorney, Agent, or Firm* — Weaver Austin Villeneuve & Sampson, LLP

(57) ABSTRACT

Portable multimedia devices, and techniques for their manufacture, are provided that feature functional parts embedded with a resin matrix that obviates the need for traditional structural components such as midframes and/or outer casings. The resin matrix may be provided through the use of a flowable liquid resin that is flowed around the functional components within a mold cavity. The liquid resin may then be cured into the resin matrix.

14 Claims, 10 Drawing Sheets

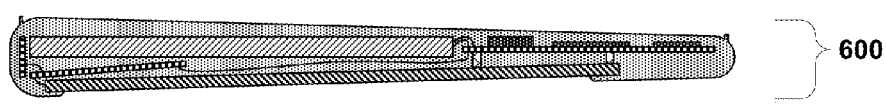
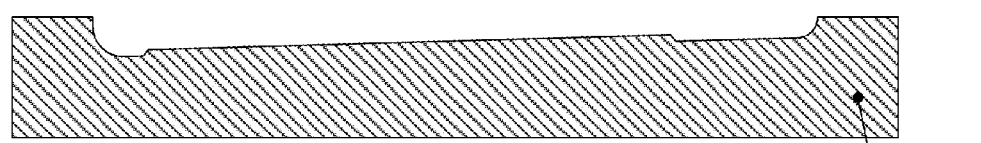
Figure 6K
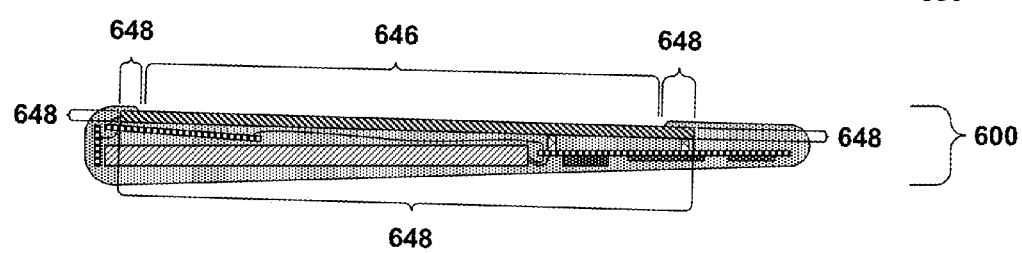
Figure 6L
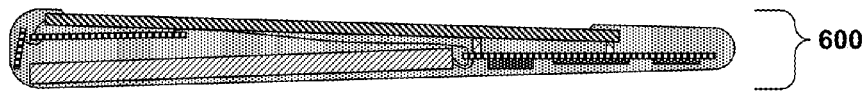
Figure 6L'
Figure 6L"
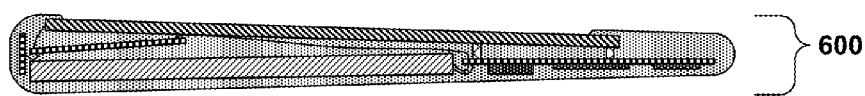
Figure 6L'"

RESIN-ENCAPSULATED PORTABLE MEDIA DEVICE

BACKGROUND

Portable multimedia device (PMD) designs have, over the years, continually evolved into highly-complex, tightly-integrated, and fully-featured products such as smartphones, tablets, e-readers, and other devices. Due to the complexity of PMDs, the manufacturers of such devices typically purchase components from various suppliers who, in turn, may purchase subcomponents from other suppliers, and so forth. As a result, many components are often modularized or standardized, e.g., semiconductor chip packages, display screen modules, touch screen modules, connectors, cabling, etc., allowing the PMD manufacturer a wide degree of flexibility in component selection and feature choice. The PMD manufacturer must then arrange these components and subcomponents according to various constraints, such as overall device size, weight, ergonomic considerations, balance, etc.

Such arrangement of components and subcomponents traditionally relies on providing an overall structural support framework that is, unlike many of the components or subcomponents that provide electrical functionality, purpose-built for only one PMD design or a family of similar PMD designs. Such structural support frameworks typically include a component referred to in the industry as a "midframe." Such structural support frameworks may also, or alternatively, include components such as an outer housing or casing, which may take a variety of forms, including a front/back cover that are snapped, screwed, glued, or otherwise held together or to a midframe. In some instances, the midframe may be an entirely or substantially internal component, although in other instances portions of the midframe may form part or a substantial part of the exterior of the device. These primarily structural components are often quite intricate and must often be manufactured ex situ from the PMD assembly process and to exacting tolerances due to the compactness desired in PMDs. This may increase the manufacturing cost of such components.

BRIEF DESCRIPTION OF DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

FIGS. 6A through 6L''' depict simplified sectional side views of various stages in a manufacturing technique for making a resin-matrix PMD.

DETAILED DESCRIPTION

Figure 1:
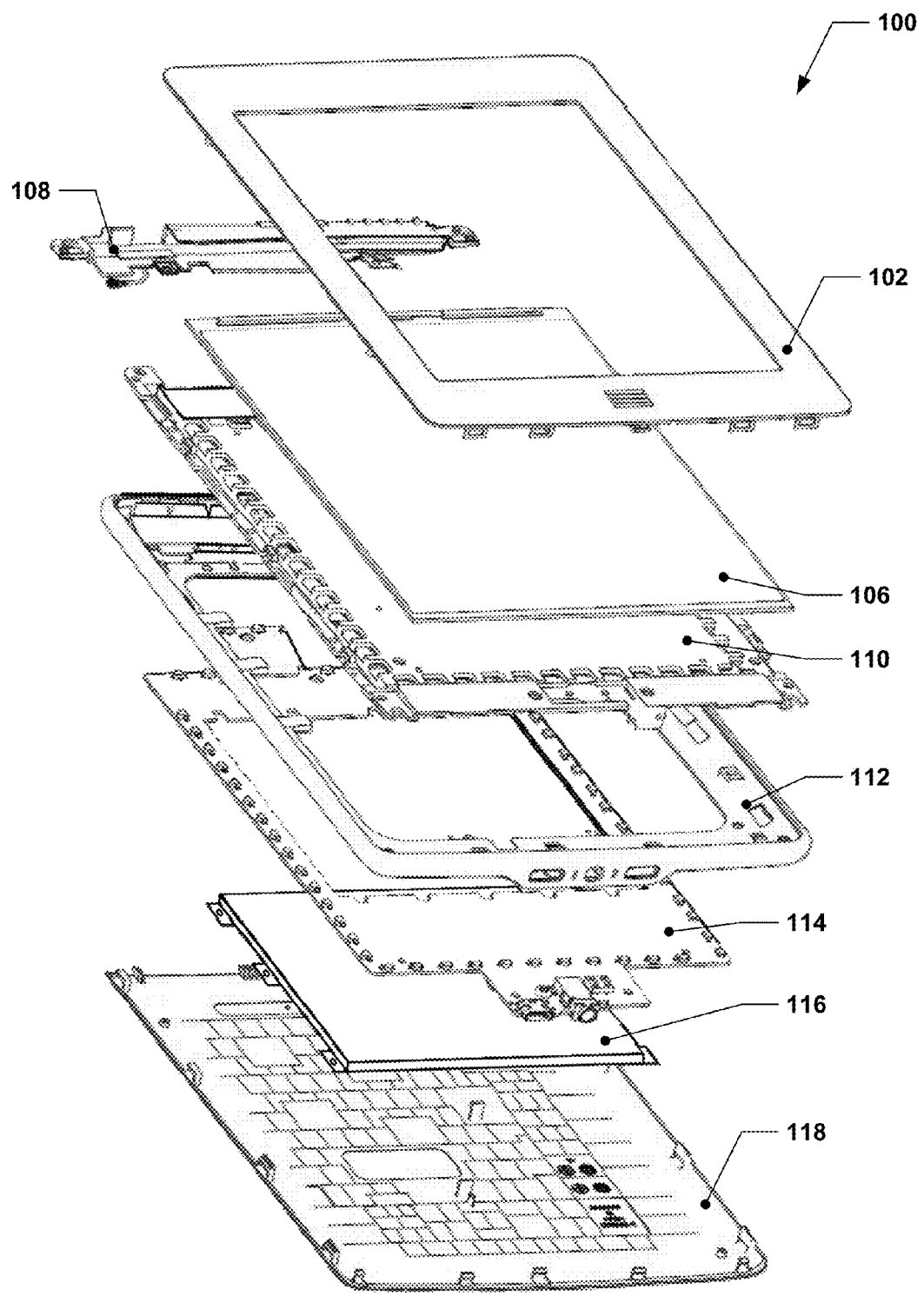
FIG. 1 depicts an exploded view of a conventional portable multimedia device (PMD).

Described herein are various PMD designs, and techniques for their fabrication, that, through the use of a conformal resin matrix to support various internal functional components, do not require typical structural parts found in conventional, non-matrixed PMD designs, e.g., that do not require midframes, outer housings, etc. The various functional components of a PMD may be electrically assembled into a device assembly that is then placed into a mold cavity. Liquid resin may then be flowed into the mold cavity to substantially encapsulate the device assembly, although some portions of the device assembly, e.g., plugs, jacks, connectors, speakers, touch/display surfaces, etc. may be dammed off from the mold cavity or otherwise kept free of resin. The resin may then be cured into a solid matrix, providing an overall structural component that provides conformal support to substantially all of the functional internal components.

Reference may be made herein to "structural" or "primarily structural" components and "functional" or "primarily functional" components. It is to be understood that the terms "structural" or "primarily structural" components refer to components that primarily exist to act as a framework for locating other components in space relative to each other in a substantially rigid manner and to support those components during normal operation of the PMD. Structural or primarily structural components may also serve as an external handling surface for transferring external loads to functional components of the PMD. Structural or primarily structural components may, as discussed previously, provide other functionality as well, but this other functionality is ancillary to the structural framework provided by such components.

The role of the primarily structural components is, as suggested by the term used to describe them, primarily structural in nature. The primarily structural components may sometimes include components or sub-portions of components that provide other functionality, such as ergonomic grips, antenna frames, button covers, or other parts providing other functionalities. The primarily structural components may provide a framework upon which other components, e.g., components that are typically less robust than the primarily structural components, may be mounted, either directly or indirectly via other components or subcomponents.

In contrast, the terms "functional" or "primarily functional" components refer to components that exist primarily to provide some aspect of electrical functionality to the PMD. Functional or primarily functional components may, of course, also contribute to the support of other components (or themselves) or to the overall rigidity and strength of the PMD, but this is not their primary function and they generally cannot be replaced with substantially non-electrical components without rendering the PMD non-functional or sacrificing at least some PMD electrical functionality. For example, a PMD may include a power source, e.g., a battery, that may be contained within a battery housing; the battery is included in the PMD to provide electrical power rather than for structural purposes. However, due to the structure of the battery itself, the battery may also contribute to the overall stiffness and strength of the PMD. Removing the battery and replacing it with a primarily structural component would cause the PMD to cease functioning due to loss of power. Similarly, the display module for a PMD is included for the purpose of turning electrical signals into externally-observable graphical content. The display module may, of course, provide some structural elements as well, e.g., a cover glass that protects the display elements used from damage from external sources or from dust and that may contribute to the overall stiffness and strength of the PMD. The display module overall, however, is not a component that has a primary purpose of providing structural support and would thus not be classified as a primarily structural component.

In this disclosure, reference to "structural components" or "primarily structural components" is to be further understood to refer to components that primarily provide structural support and are machined or formed ex situ with respect to the PMD assembly process, such as machined or injection molded midframes, rather than in situ with respect to the PMD assembly process, such as a resin matrix.

As mentioned previously, one type of structural component used extensively in many current PMDs is the midframe. In some instances, the midframe may be an entirely or substantially internal component, although in other instances portions of the midframe may form part or a substantial part of the exterior of the device, e.g., the outer perimeter of the iPhone 4™ midframe assembly actually forms the exterior sides of the iPhone 4™. Many midframes may have a footprint that substantially corresponds to the overall footprint of the PMD, although they may, if completely internal, be slightly smaller so as to fit within the outer envelope of the PMD.

The midframe and other primarily structural components of a PMD are typically manufactured from a rigid material, such as metals, plastics, or composites, and may be machined or produced using net-shape or near-net-shape manufacturing techniques, such as casting or injection molding. As mentioned earlier, these primarily structural components are often quite intricate and must often be manufactured to exacting tolerances due to the compactness desired in PMDs. Such primarily structural components may include numerous features such as threaded holes, through-holes, ledges, ridges, support bosses, countersinks, cable pass-throughs, etc. to facilitate mounting of components and subcomponents to the primarily structural components at various stages of assembly in an assembly line. Additionally, the primarily structural components may include structural features that join such mounting features into a single, integrated part or assembly. Such structural features may include beams, plates, ribs, cut-outs, etc.

Thus, for example, a display module and a printed circuit board with processors for a PMD soldered to it may be mounted via a plurality of screws to a midframe. A battery may also be connected to the midframe with a separate plurality of screws. A wireless module, e.g., a wireless antenna module, may also be connected with the midframe by another plurality of screws.

Due to the demand for smaller, lighter, and thinner electronic devices, engineers designing midframes and other primarily structural components must often push the performance limits of the materials used to manufacture such components. Considerable effort may be expended to determine what the minimum dimensions are for various portions of a midframe that will provide a desired degree of overall PMD stiffness and ruggedness while still allowing the components connected to the midframe to fit within a target envelope for the PMD. Due to modern analysis software, design optimization may result in some such dimensions being reduced to somewhere on the order of hundredths or thousandths of an inch. In such cases, normal engineering tolerances, e.g., ±0.005, may actually have a significant impact on the strength of the part and, as a result, must be replaced by more exacting tolerances. This may increase the manufacturing cost of such components.

FIG. 1 depicts an exploded view of a PMD. The PMD 100 shown in FIG. 1 includes a front cover 102 (which also acts as a display bezel in this case), a display module 106, a wireless module 108, a midframe 110, a frame 112, a printed circuit board (PCB) 114, a battery 116, and a back cover 118. Other PMDs may include similar components, although some components may be omitted or combined with other components and additional components may be included, e.g., speakers. It is to be understood that the concepts discussed herein may be applied to a variety of different PMD designs, and that these additional implementations fall within the scope of this disclosure.

When fully assembled, the midframe 110 may provide structural support to the PCB 114, the display module 106, and the battery 116. The midframe 110 may, in turn, be supported by the frame 112, which may also support the front cover 102 and the back cover 118. Some of these components may be screwed together, e.g., screws may be threaded through holes or slotted holes around the perimeter of the midframe 110 and into threaded holes located on the frame 112 to clamp the midframe 110 to the frame 112. Some of these components may snap together or be otherwise connected. For example, the front cover may snap into or be glued (or taped using double-sided tape) to the frame 112. In large part, the various components shown may be assembled so as to be disassembled later with little or no destruction of the components, e.g., the use of screws and other removable fastening systems may allow the device to be disassembled for repair, customization, or other purposes and then reassembled (of course, some components may need replacement, e.g., double-sided tape used in such an assembly may need to be replaced with new double-sided tape). In general, manufacturers of PMDs have avoided adopting product designs and manufacturing methods that result in such PMDs being irreversibly assembled (at least, irreversible without incurring substantial damage to the internal components of such PMDs).

The present inventors have realized that PMDs may be manufactured substantially without separately-produced primarily structural components, e.g., without one or more of a midframe, frame, front cover, or back cover, by embedding a portion of the display module of the PMD as well as substantially all of the internal, functional components of the PMD in a liquid resin matrix that is then cured into a solid resin matrix. This may have the effect of turning the PMD into a substantially solid assembly with little or no void space or free air space within. The functional components may be suspended within and supported by the resin matrix in a distributed manner across the portions of the functional components that may be in contact with the resin matrix.

In addition to supporting the functional components structurally, the resin matrix may also act to seal the internal functional components from exposure to moisture or other environmental contaminants, e.g., dust. This may waterproof most or all of the PMD, rendering it suitable for use in environments normally viewed as hostile to electronic devices, e.g., swimming pools, inclement weather, beaches, construction sites, etc. Because the liquid resin may be flowed around the functional components and then cured into the solid resin matrix, the resin may occupy the same fluid flow paths that moisture may later attempt to occupy, thus preventing liquids and particulates from reaching the functional components embedded within the matrix.

This technique allows for the substantial reduction, or even elimination, of the need for high-tolerance structural components in PMDs. This is because the resin may be flowed around the functional components and then cured with the functional components in-place, thus resulting in a resin matrix that is in contact with the functional components across virtually all of the functional components' surface area that is wettable by the resin in the liquid state regardless of exactly how the functional components are positioned with respect to one another. The resin matrix, in effect, becomes a substantially monolithic structural component that conforms to whatever three-dimensional arrangement of functional components exists at the time the resin is poured and cured into the resin matrix, thereby largely obviating the need for pre-machined or pre-formed structural components. In contrast to the phrase "structural" component or "primarily structural component," as discussed above, the phrase "substantially conformal overall structural component" may be used to refer to a resin matrix that is cast around the functional parts of a PMD. It is to be understood that the conformal nature of the resin matrix may only be substantially conformal since there may be some portions of the resin matrix that, due to air bubbles or other occasional voids, e.g., components such as buttons or speakers that must be kept at least somewhat free of resin in order to function, are not in complete contact with the functional components. Furthermore, it is to be understood that reference to primary structural components or structural components, without further qualification as being "substantially conformal overall structural components," refers to traditional, separately-manufactured structural components such as midframes, front covers, back covers, outer casings, etc., rather than to resin matrix conformal parts.

In contrast to conventional PMDs featuring separately-manufactured structural components, a resin-encapsulated PMD may not be readily disassembled without potentially causing significant damage to functional components. For example, the solid resin matrix may be machined or chipped away from the functional components, but such procedures may run a high risk of causing physical damage to the embedded functional components. Some solid resin materials may be dissolved away using various chemicals, e.g., epoxy resins may be dissolved using a bath of toluene, acetone, and methyl-ethyl ketone (MEK) and some polyester resins may be dissolved using a bath of isopropyl alcohol, but such solvents may also dissolve non-resin components or harm electrical components in the functional components. Generally speaking, while it may be possible to remove the resin matrix from a PMD, the cost of doing so would generally outweigh the cost of producing a new PMD of the same type, making such disassembly economically infeasible.

Figure 2:
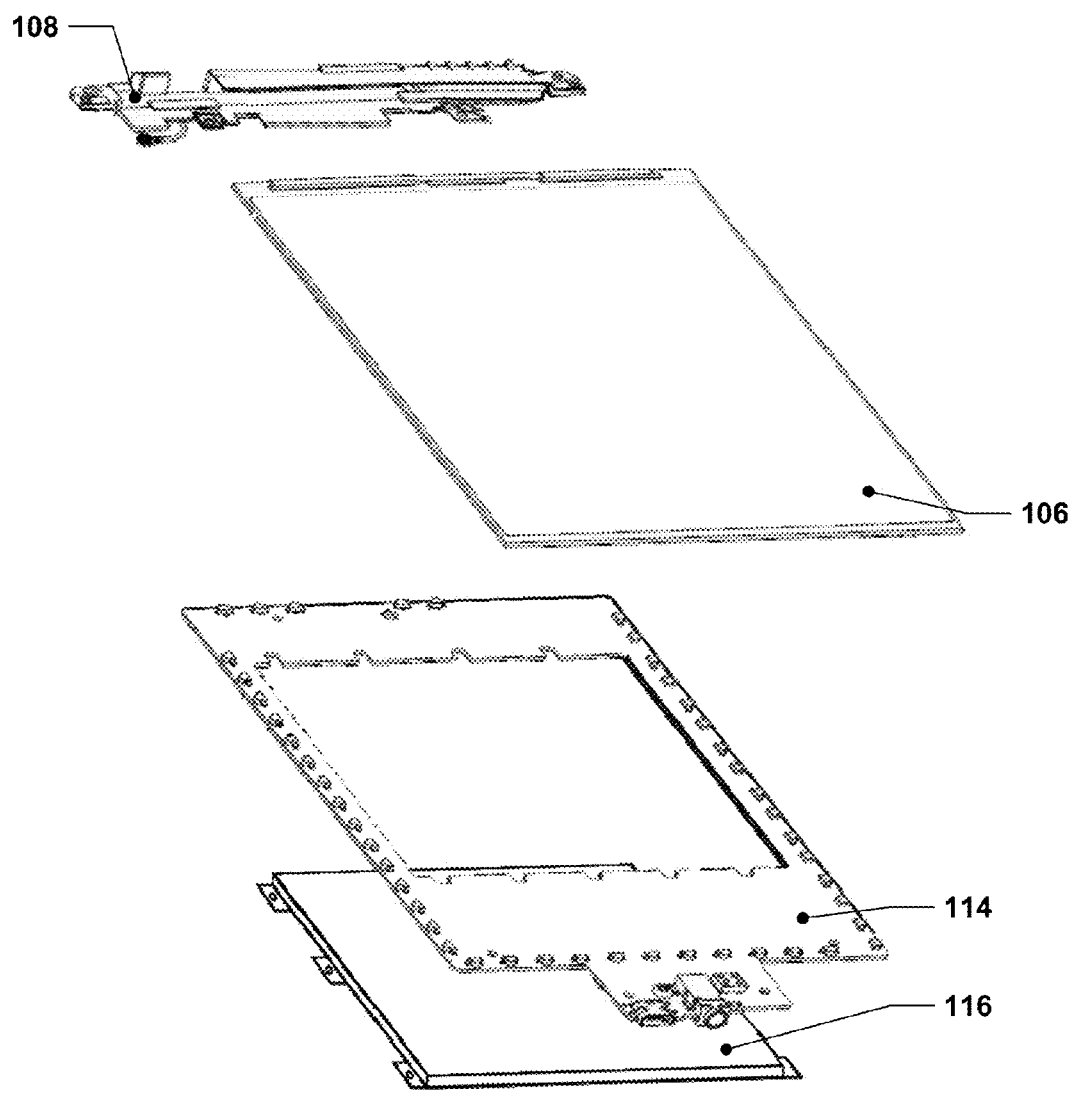
FIG. 2 depicts an exploded view of components of the PMD of FIG. 1 that are not primarily structural in nature.

The resin-matrix PMD concept is discussed further below with respect to the PMD from FIG. 1. If the PMD from FIG. 1 were to be assembled according to the resin matrix techniques outlined herein instead of using conventional structural components, the number of components needed could be significantly reduced. For example, the components from FIG. 1 that may be used in a resin-matrix PMD may be a reduced component set including the wireless module 108, the display module 106, the PCB 114, and the battery 116. These functional components are shown in FIG. 2.

The wireless module 108 may include one or more receivers, transmitters, transceivers, signal conditioners, antennae, or other components associated with wireless communications. In some implementations, the wireless module 108 may be integrated into another functional component, e.g., into the PCB 114. The wireless module may be configured to provide communications capabilities according to one or more wireless standards, e.g., per 3G, 4G, BLUETOOTH®, 802.11, or WIMAX® standards.

The battery 116 may be a single-cell design or may be a multi-cell battery pack. The battery 116 may serve as a power source for the PMD, although other power sources may additionally or alternatively be used, e.g., ultracapacitors, photovoltaic cells, etc.

The PCB may include a number of microprocessors and other electronic components that are electrically interconnected via conductive traces on or in the PCB. The PCB may also include electrical connections to other functional components, such as power connections to the power source.

Figure 3:
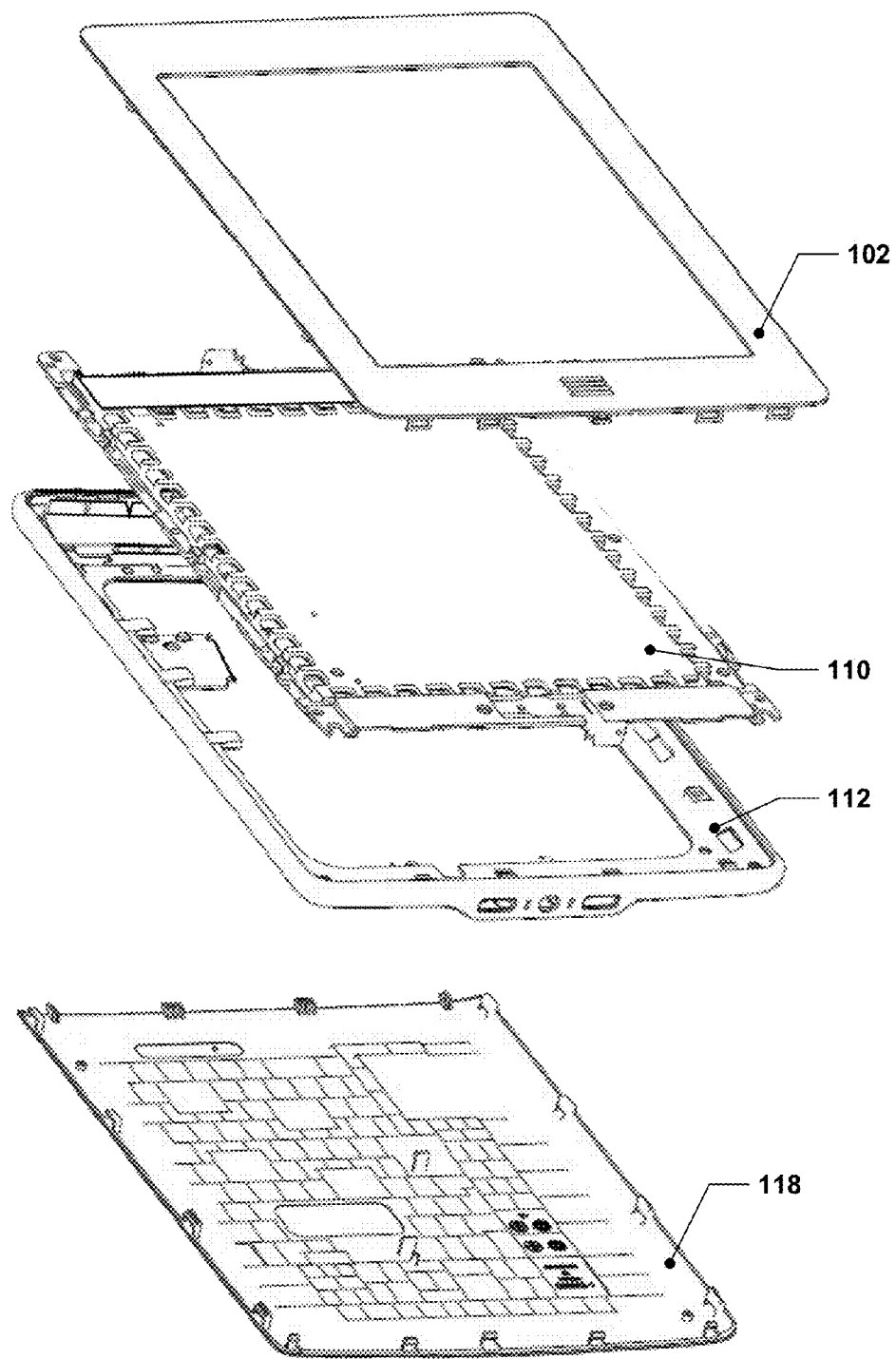
FIG. 3 depicts an exploded view of components of the PMD of FIG. 1 that are primarily structural in nature.

Conversely, FIG. 3 depicts the structural components from FIG. 1 that may be omitted in a resin-matrix PMD, specifically, the front cover 102, the midframe 110, the frame 112, and the back cover 118. Various screws (not shown) may also be omitted. Of course, FIGS. 2 and 3 depict components from existing, conventional PMD designs that may be included or omitted when converting such a conventional PMD to a resin-matrix PMD. If one were to design a PMD from the very start to be a resin-matrix PMD, then such components may appear different, e.g., screw holes or other features intended to connect functional components with structural components may be omitted or reconfigured.

Figure 4:
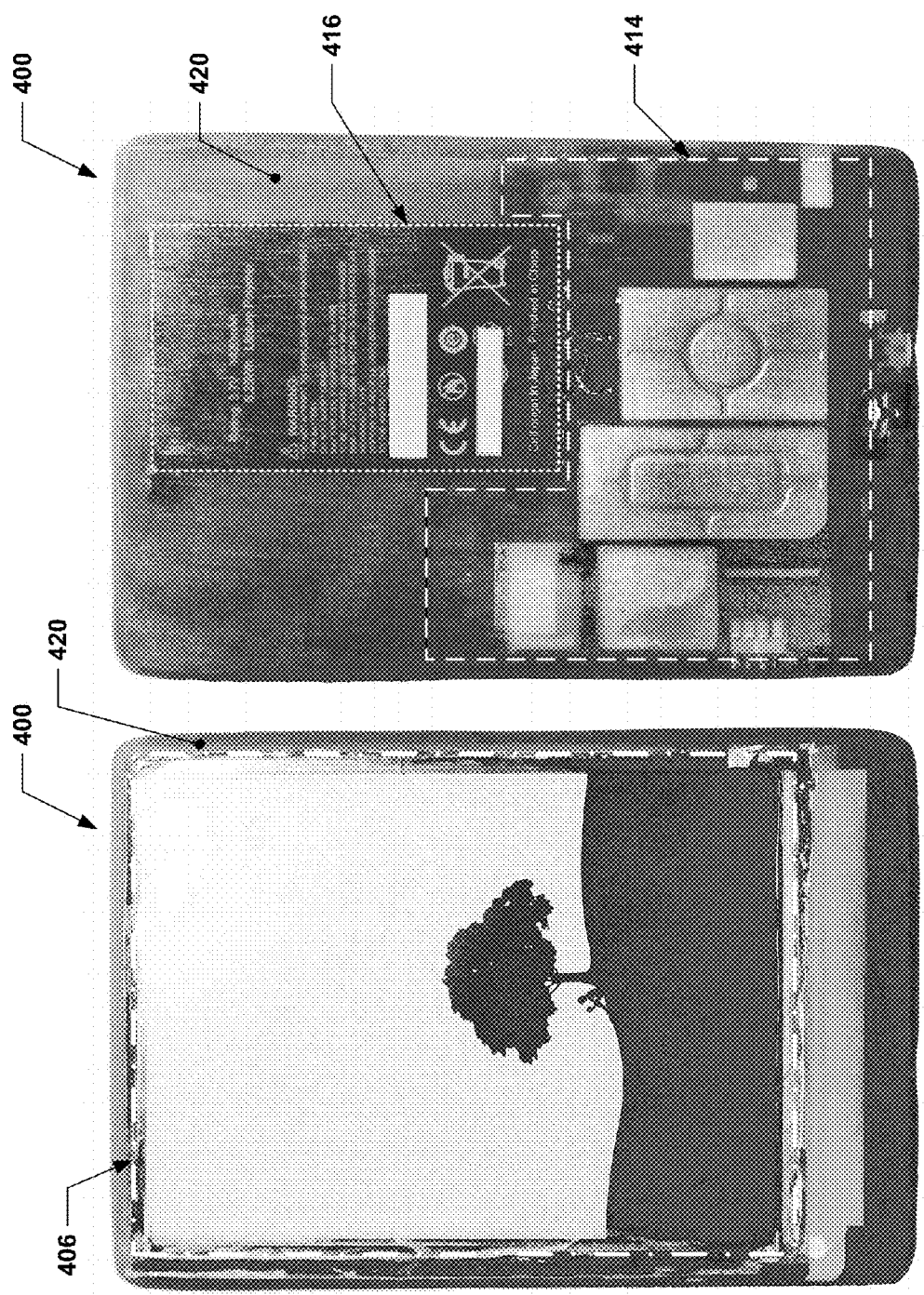
FIG. 4 depicts photographs of the front and back of a PMD where the external casing and midframe have been replaced with a cured translucent resin.

FIG. 4 depicts photographs of the front and back of a prototype PMD where the external shape and internal structural support of the device are provided by a cured translucent epoxy resin instead of discrete structural components. In this example, the resin used was EP5340 epoxy resin, offered by Eager Polymers. The EP5340 epoxy is a two-part, low-viscosity, castable resin with excellent wetting characteristics, making it well-suited for encapsulating PMD functional components that may have very tight clearances. The EP5340 epoxy is semi-translucent when cured. Visible in the front/back views of the PMD 400 of FIG. 4 are a display module 406, a battery 416, and a PCB 414, all of which are encapsulated in a resin matrix 420. The EP5340 epoxy used in the prototype shown in FIG. 4 was also mixed with a red/orange dye prior to curing, which caused the resin matrix to be a translucent orange/red color when cured.

The resin used to provide a resin-matrix PMD is not limited to the EP5340 epoxy—there may be many possible resins that may be used to manufacture a resin-matrix PMD. For example, two-component epoxy resins such as 20-3035 low density epoxy potting compound, offered by Epoxies Etc.™, may be used, as well as single-component epoxy resins. Generally, the resin used may be selected based on factors such as viscosity and wetting characteristics (to facilitate flow around and in between the functional components of the PMD), cure behavior (time to cure and cure temperature, which may impact manufacturing throughput and functional component survivability, respectively), strength, density, smell, and other factors. Some other potentially suitable materials for manufacturing a resin matrix may include polyester resins, polyurethanes, and other flowable, curable materials having a cure temperature sufficiently low enough so as to avoid damaging the functional components of the PMD.

Generally speaking, many functional parts of PMDs currently in common use are rated for exposures to maximum temperatures in the 80 to 90° C. range. The resin selected for encapsulating such functional components may be selected so as to have a maximum cure temperature below such a component temperature limit. In some implementations, the resin may be selected to have a cure temperature that is slightly higher, e.g., about 10% higher, than the component temperature limit—such temporary over-temperature exposure may not negatively affect the functional components and may allow for a resin with a shorter cure time to be used, thus increasing manufacturing throughput. In some implementations, a resin with a significantly higher cure temperature, e.g., 170° C., may be used if the functional components being encapsulated are rated to a sufficiently high temperature. Such high-temperature functional components may be considerably higher in cost than lower-temperature components, however.

Figure 5:
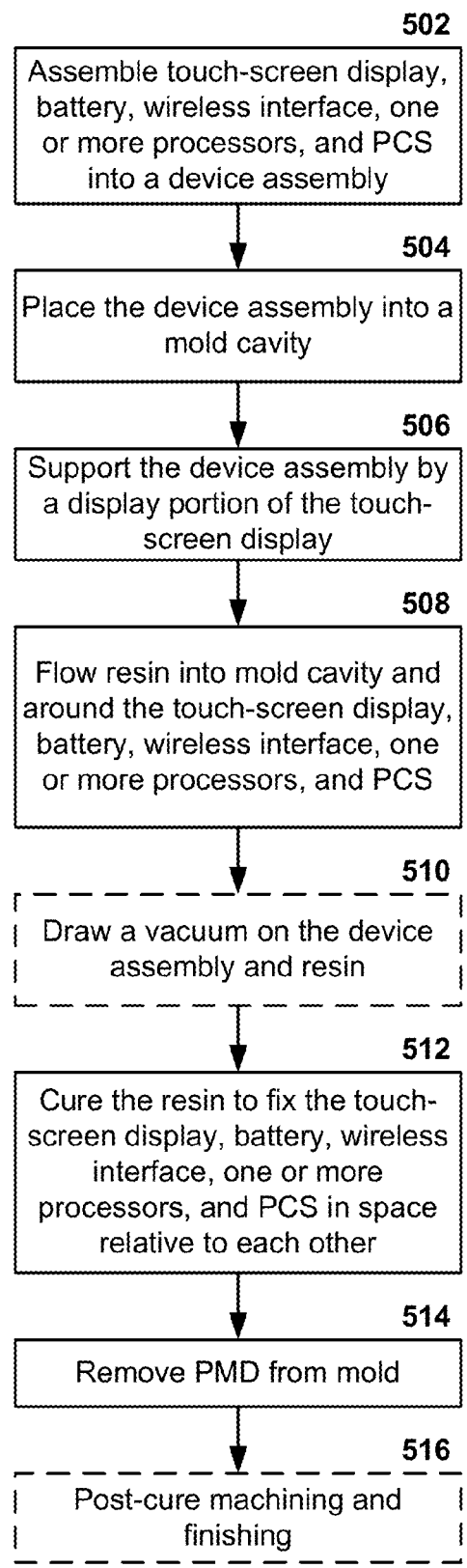
FIG. 5 is a flow diagram of one technique for manufacturing a PMD without requiring the use of a midframe or other separately-manufactured, primarily structural component.

The technique used to produce the resin-matrix PMD shown in FIG. 4 is outlined in substantial part in FIG. 5, which depicts a flow diagram for a resin-matrix PMD manufacturing technique.

The functional components were electrically assembled into a device assembly, i.e., electrical connections via solder connections, cable connections, or other electrical connection technology were made so that the electrically-assembled functional components formed an electrically operable assembly. This is represented in block 502 of FIG. 5. Some of these connections may be made at the device assembly level, e.g., connecting two components together via a cable or connector, whereas others may have been made earlier in the manufacturing stream (or even by suppliers), e.g., one or more processors electrically connected to a PCB may have been supplied with the PCB and may not require separate electrical connection to the PCB when the electrical connections for the device assembly in block 502 are being made.

Due to the semi-translucent nature of the resin matrix 420 in this example, various internal functional components are visible, including a battery 416 and a PCB 414 having one or more processors affixed thereto that are visible in the back view, and a display module 406 that is visible in the front view. However, it will be understood that implementations are contemplated in which the degree of translucency or transparency may vary considerably including, for example, implementations that range from substantially transparent to substantially opaque.

The electrically-assembled functional components were then placed into a mold having a mold cavity conforming to the exterior envelope of the Portable Electronic Device. This is represented by block 504 of FIG. 5. The mold cavity may be engineered to have whatever external shape for the PMD is desired—it is not limited to the shape of the Portable Electronic Device, but may correspond to any of a variety of existing PMD design or to entirely new PMD designs. In this case, the mold was a latex mold that was cast around an existing, fully-assembled Portable Electronic Device, which was then removed after the latex mold material had set to form a mold cavity.

The electrically-assembled functional components were placed within the mold cavity largely without the need for precise placement, although some functional components were more precisely located relative to the mold cavity. For example, while most of the functional components may be fully encapsulated within the resin matrix, it may be desirable to avoid encapsulating the portion of the display module that is configured to show graphical content, referred to herein as the "display portion," in resin since the resin may obscure or distort the graphical content shown by the display module. Thus, in the example shown in FIG. 4, the display module 406 was positioned to be in the same location relative to the mold cavity as the display module in a non-resin-matrix version of the PMD and the display portion of the display module 406 was also dammed off from the rest of the mold cavity to prevent liquid resin from flowing over the display portion. At the same time, the dam served as a support for the internal functional components by directly supporting the display module which, in turn, supported the various other internal functional components, either directly or indirectly. This is reflected in block 506 of FIG. 5.

In some implementations, the display module (or other functional components that are to be only partially encapsulated in the resin matrix) may be dammed off from the mold cavity by placing the display portion against a portion of the mold cavity interior surface that is covered in a mild adhesive, thus adhering the display module to the mold cavity interior surface via the adhesive bond between the display portion and the mold cavity interior surface.

After the functional components were placed in the mold cavity and the display portion dammed off, liquid resin was poured into the mold cavity via one or more resin inlets. This is reflected in block 508 of FIG. 5. A vacuum source was applied to the mold cavity to assist in de-gassing the liquid resin during the cure and prevent the formation of void spaces within the resin matrix. This is reflected in block 510 of FIG. 5. While application of a vacuum to the mold cavity may not be necessary in some implementations, utilizing a vacuum may help eliminate or minimize void spaces or poor mold-resin contact.

After pouring the liquid resin into the mold cavity, the liquid resin was allowed to cure into a solid resin matrix. Depending on the resin selected, such curing may be time-based, or may require additional environmental stimuli, e.g., exposure to ultraviolet light or to a particular temperature. The cure phase is indicated in block 512 of FIG. 5.

After the liquid resin had cured into a resin matrix, the mold cavity was opened and the resulting fully-functional resin-matrix PMD was removed. This is represented in block 514 of FIG. 5. If needed, additional machining or clean-up of the removed PMD may be performed, as shown in block 516 of FIG. 5.

Various variations on this technique may be practiced. For example, after the resin matrix is set, the resulting PMD may be subjected to further processing, e.g., polishing, etching, texturing, engraving, machining, etc. In some implementations, the mold used may be a generic or rough mold, and substantial post-cure machining, e.g., machining some material away from substantially all of the exterior surfaces of the resin matrix, may be performed on the PMD in order transform the rough-molded PMD into a finished product. In conventional PMDs, machining of an assembled PMD does not occur (aside from decorative processes such as engraving) since the vibration and/or heat associated with such processes may damage the functional components housed within the structural components since such vibrational motion tends to concentrate at the support interfaces for the structural components. In resin-matrix PMDs, however, any vibrational input is substantially evenly applied across all of the functional components since the resin matrix is in substantially full contact with the functional components. Thus, functional components in resin-matrix PMDs do not see the vibrational stress concentration that functional components in conventional PMDs may see, allowing resin-matrix PMDs to be machined with reduced risk to the functional components within. Additionally, due to the substantially waterproof nature of resin-matrix PMDs, liquid coolant may be used during the machining process (if needed) to prevent heat damage to the functional components within the PMD from the machining.

In some implementations, an optically clear or translucent resin may be used to allow the functional components embedded within the resin matrix to be visible. This aesthetic effect may appeal to certain market segments. In other implementations, the resin matrix may be painted after curing or may be mixed with a dye or colored powders prior to curing, e.g., prior to being introduced into the mold cavity, such that the resulting resin matrix is not translucent or transparent but colored. This may allow a PMD to be offered in a variety of different colors (or even custom colors selected by a retail customer), and may obscure the internal components from view.

In some implementations, additives may be mixed with the liquid resin to achieve various technical effects. For example, the liquid resin may be mixed with microbeads, microspheres, or other particulates. The microbeads or other particulates may be hollow and may thus act to reduce the overall density of the PMD (since such microbeads are sealed structures, the application of vacuum to the liquid resin during the molding process would not cause the volume within the microbeads to evacuate). This density reduction may be used to offset the weight of heavier components, e.g., the battery and display module, as well as the weight attributable to the resin. In some implementations, the overall resin matrix density may be adjusted in this manner such that the PMD has positive buoyancy in water, preventing it from sinking if it were to be dropped into a pool or other body of water.

Other materials that may be mixed with the liquid resin to form a composite matrix may include fibers or other reinforcing material, thermally-conductive or thermally-resistant materials to enhance or reduce the thermal conductivity of the resin matrix (depending on the thermal conductivities desired), etc. For example, carbon or glass fibers may be introduced in the resin to produce a fiber-reinforced composite matrix with superior strength and toughness.

It is to be understood that while resin-matrix PMDs may not require primarily structural components, some intermediate structural components may still be used to provide some support to functional components during the curing process. Such intermediate structural components may not be capable, without the subsequent encapsulation of the functional components in the resin matrix, of supporting the functional components during normal handling of the PMD without a substantial risk of breakage. In some implementations, for example, it may be desirable to space the display module away from the PCB using a spacer, e.g., a plastic structure inserted between the display module and the PCB—the plastic structure may rest on the display module and support the PCB. However, the plastic structure would not generally be capable of providing this support during normal use of the PMD, and simply supports the PCB during the molding process.

Some intermediate supporting structures may be stronger and more robust. For example, the plastic structure discussed above may also include screwed connections to the display module and to the PCB to provide stability during insertion into the mold cavity. Again, while such connections may be sufficient to provide structural support of the functional components during the assembly process, they are not designed or intended to provide meaningful functional component support during normal handling by a consumer—such support is instead substantially provided by the resin matrix.

FIGS. 6A through 6L''' depict simplified cross-sectional diagrams of various stages in resin-matrix PMD production, and depict some of the phases from FIG. 5 pictorially.

Figure 6A:
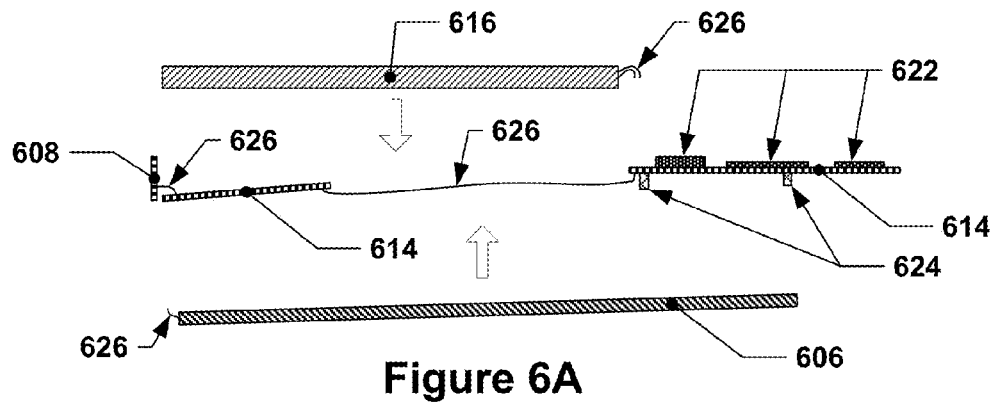

In FIG. 6A, a device assembly 634 (see FIG. 6D for the assembled device assembly and reference number indication) may be created by establishing electrical connections between various functional components of a PMD. For example, one or more of a wireless module 608, two PCBs 614, a battery 616, and a display module 606 may be electrically connected with one another via cables or wires 626. In this example, one of the PCBs 614 may have one or more processors soldered to it prior to assembly into the device assembly. Additionally, standoffs 624, i.e., intermediate structural components, may be used to fix one of the PCBs 614 in space relative to the display module 606—standoffs 624 may be sufficiently strong enough to hold the PCB 614 in a fixed relative position with respect to the display module 606, but may not be strong enough to do so during normal use of the PMD (absent the resin matrix).

Figure 6B:
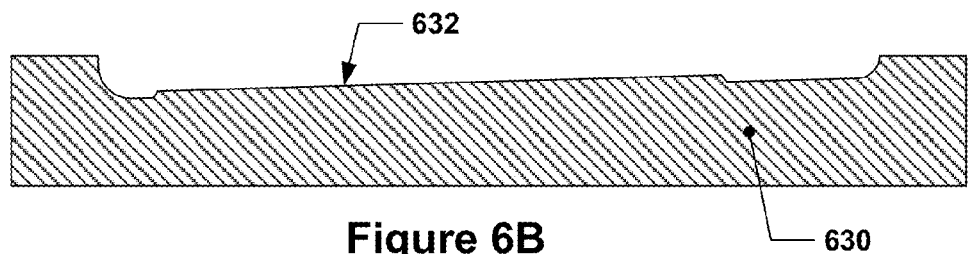
Figure 6C:
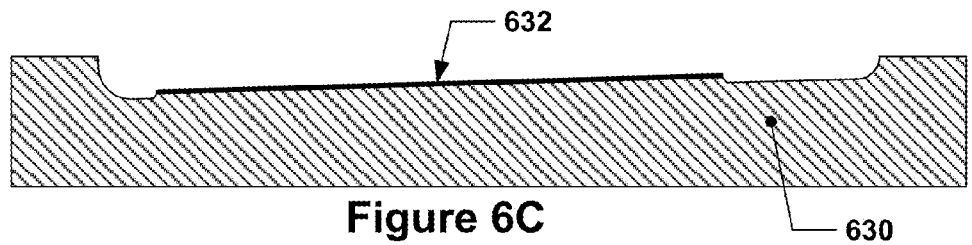

In FIG. 6B, a bottom mold 630 is prepared to receive the device assembly. Such preparation may involve coating the mold with a mold-release agent to facilitate later removal of the PMD. Another aspect of such preparation may be the application of a mild adhesive or other material to a display module support surface 632 of the bottom mold 630; this is illustrated in FIG. 6C. The mild adhesive or other material may help hold the device assembly in place and seal off a display portion (see FIG. 6L for depiction of the display portion of the display module in this instance) of the display module from the mold cavity.

Figure 6D:
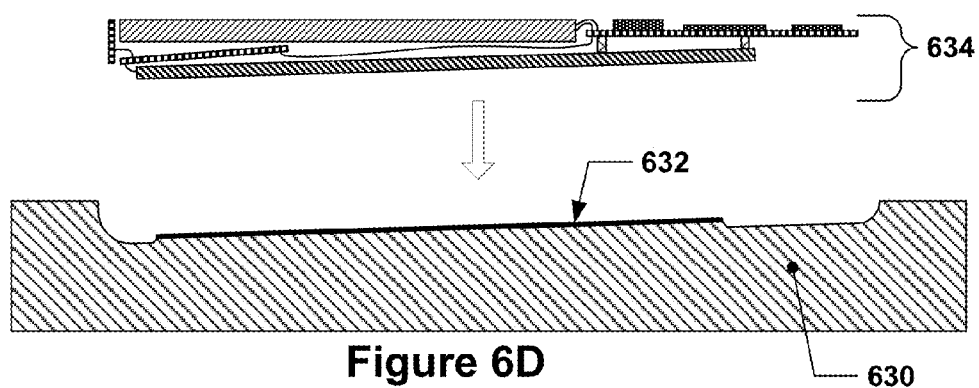

In FIG. 6D, the device assembly 634 may be placed into the bottom mold 630 and located such that the display portion of the display module 606 is placed in the desired location relative to the overall PMD exterior envelope that is defined by the mold cavity of the bottom mold 630.

Figure 6E:
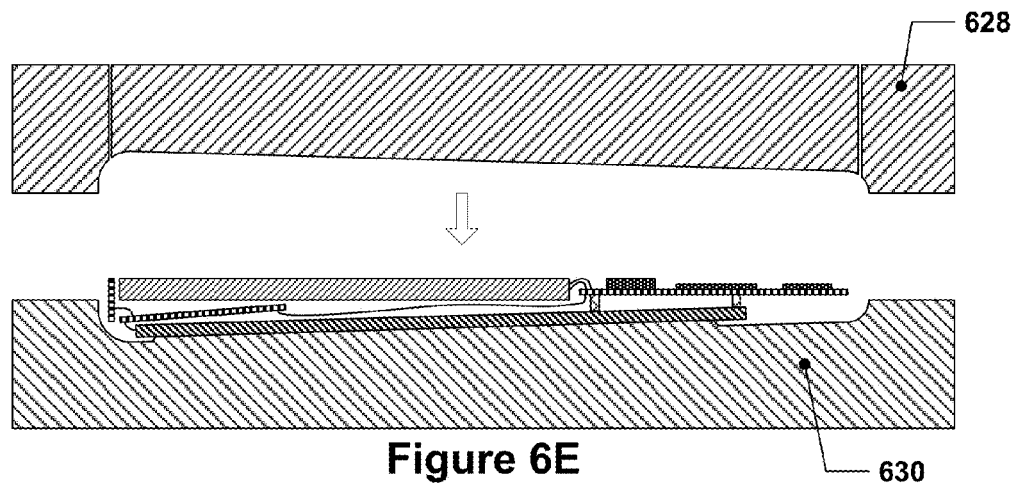
Figure 6F:
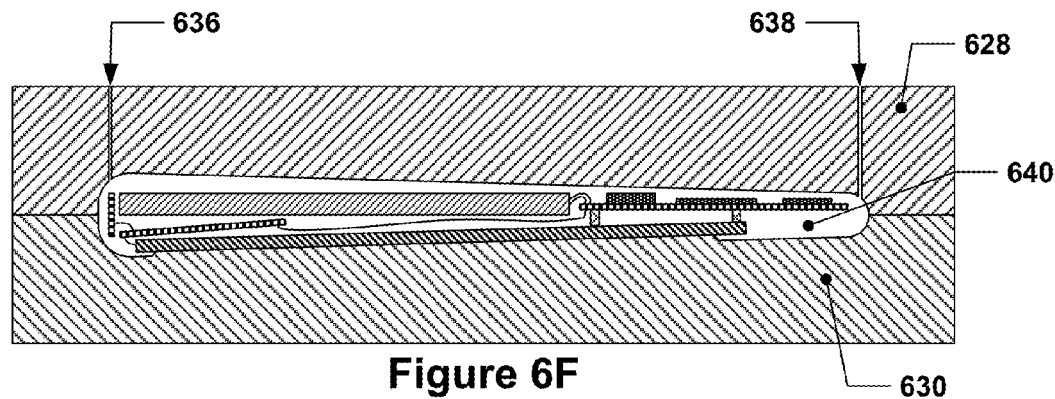

In FIG. 6E, a top mold 628 may be placed on top of the bottom mold 630, thus trapping the device assembly 634 within, as seen in FIG. 6F. The top mold may also be treated with a release agent, if needed. The top mold 628 may include one or more resin inlets 636, as well as one or more vacuum ports 638. Such resin inlets and vacuum ports may additionally or alternatively be located in the bottom mold 630. The resin inlets 636 and the vacuum ports 638 may be in fluidic communication with a mold cavity 640 formed between the top mold 628 and the bottom mold 630. The mold cavity 640 may contain the device assembly 634. In some implementations, the device assembly 634 may be somewhat loosely assembled within the mold cavity 640, but functional components within the device assembly 634 may nonetheless not touch the walls of the mold cavity 640 except at, for example, the display module support surface 632 or other, similar support surface (not shown, although, for example, a similar support surface or feature may be used to locate external plugs or connectors that may need to be positioned in a particular location with respect to the exterior of the PMD).

Figure 6G:
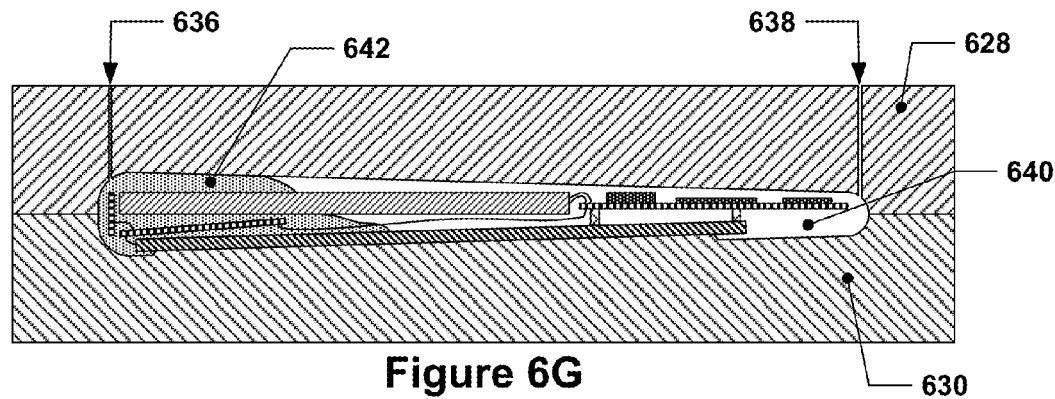
Figure 6H:
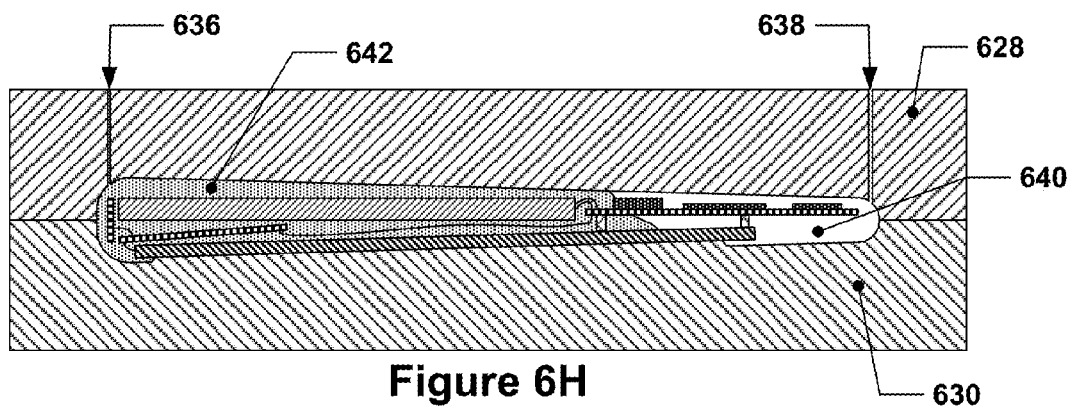
Figure 6I:
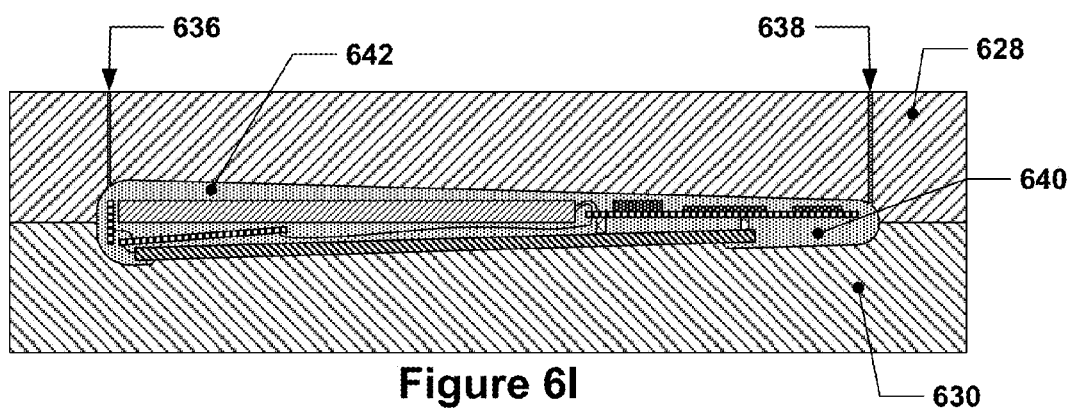

In FIG. 6G, a liquid resin 642 is being flowed into the mold cavity 640 via the resin inlet 636. The supply of liquid resin 642 to the resin inlet 636 may be a gravity-fed supply or may be a pressurized supply depending on the viscosity of the resin, the size and length of the resin inlet 636, and other factors. If a vacuum is applied to the vacuum port 638, this may assist in drawing the liquid resin 642 into the mold cavity 640. The flow of liquid resin may continue, as shown in FIGS. 6H and 6I, until the mold cavity 640 is substantially fully filled with liquid resin 642. As can be seen, the liquid resin 642 may flow over the front of the display module 606 (located on the underside of the display module 606 in the FIG. due to the display portion of the display module 606 facing downwards in this view) around the perimeter of the display portion, thus forming a bezel around the display portion.

At this point, the liquid resin 642 may be allowed to harden or cure (this may require exposing the liquid resin to appropriate environmental stimuli sufficient to initiate cure) into a resin matrix 642'.

Figure 6J:
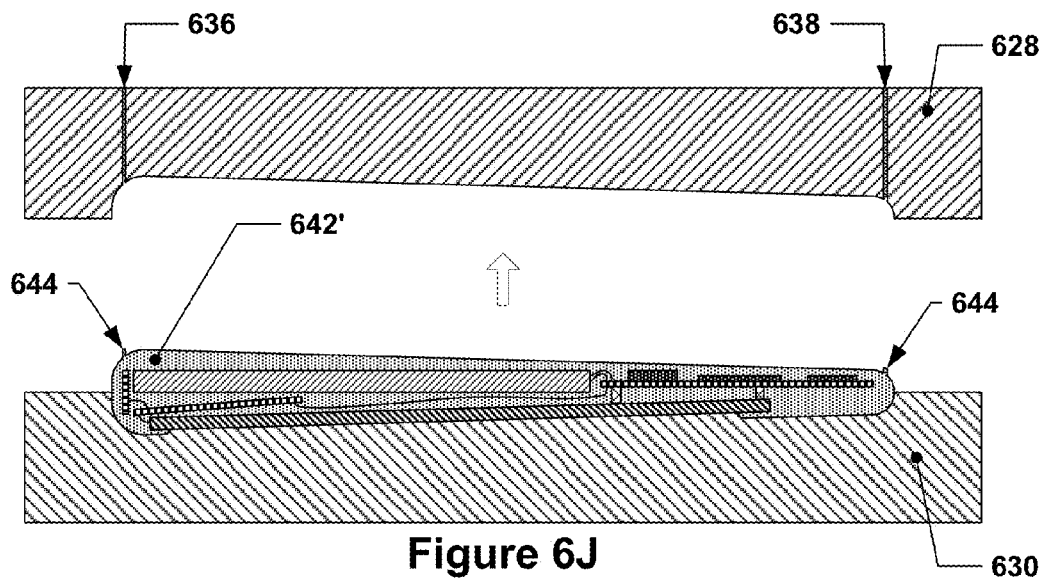

In FIG. 6J, the top mold may be removed from the mold assembly, and in FIG. 6K, the resulting resin-matrix PMD 600 may be removed from the bottom mold. In some implementations, the top and/or bottom molds may include features to assist with PMD 600 removal, e.g., lift pins or other features to facilitate de-molding operations (not shown). When the PMD 600 is de-molded from the molds, some extra solid resin material may remain in the form of sprues (the resin inlet may take the form of a "sprue" in a mold) or gate marks (a gate refers to the location at which the resin may enter the mold cavity from a sprue or resin inlet) 644 that protrude from the PMD 600.

FIG. 6L depicts the PMD 600 with the display portion 646 of the display module 606 facing upwards, i.e., flipped over from the orientations of the display module 606 in earlier FIGS. 6. As can be seen, all of the functional components from FIG. 6A have been fully encapsulated within the resin matrix 642', with the exception of the display module 606. The display module 606 is only partially encapsulated within the resin matrix 642'. The display portion 646 may be free of the resin matrix 642', allowing for clear viewing of graphical content displayed in the display portion 646 (and allowing for uninhibited interaction with touchscreen controls located within the display portion). However, the remaining portion 648 of the display module 606, which may include the edges surrounding the display portion 646, the sides of the display module 606, the back surface of the display module 606, and the electrical interface of the display module 606 configured for receiving power and data may be embedded within the resin matrix 642'.

FIGS. 6L' through 6L''' depict further examples of PMDs 600 that may be manufactured using the molds and technique of FIGS. 6A through 6K. As can be seen, there may be considerable variation in the exact locations of many of the functional components within the PMD from unit to unit. Such variation is easily accommodated by the conformal nature of the resin matrix.

It is to be understood that while the examples discussed herein have utilized PCBs to provide electrical circuits and processor mounting locations, a PMD as discussed herein may utilize other structures to provide similar functionality. For example, a printed circuit substrate (PCS) may be provided using a flexible substrate, e.g. a flex circuit, that has considerably more flexibility than a traditional circuit board.

In some implementations, while substantially all of the free space within a resin-matrix PMD may be occupied by the resin matrix, some regions of the PMD may be designed to remain free of the resin matrix. For example, while many functional components within a PMD are solid-state devices with no moving parts, some functionality of PMDs may require moving parts and regions of a PMD containing such moving parts may need to be kept free of the resin matrix to ensure proper operation of such parts.

For example, many speakers and microphones, both of which may be included in a PMD (especially in PMDs such as smartphones), utilize vibrating diaphragms that leverage the relationship between diaphragm position and electrical signal. If the diaphragms are encapsulated in a resin matrix, they will not be able to vibrate freely and speakers or microphones utilizing such diaphragms will be useless. Accordingly, such functional components may be provided in a sealed housing within the resin matrix. If such functional components require access to the exterior of the PMD, e.g., a speaker grill or microphone port, then it may be necessary to seal the exterior access port against potential leakage of the liquid resin into the exterior access port, similar to how the display portion of the display module may be kept free of liquid resin. Such techniques may be used, for example, to allow for plugs, jacks, or other connector receptacles or ports to be placed on the outer perimeter of a PMD without rendering them non-functional due to the receptacle being filled with resin matrix.

For functional components that are not entirely encased in the resin matrix, it may be necessary to provide for additional features that protect such functional components from damage due to liquid exposure if such protection is desired. For example, in the case of a display module that is not fully encapsulated in the resin matrix, the exposed portion, e.g., the display portion, may be covered by a protective cover glass that seals moisture-vulnerable components, such as the electrical components of the display module, from exposure to moisture.

In the case of externally-accessible jacks, plugs, or connectors located along the periphery of the PMD, various approaches may be taken. For example, one approach is to recess such features into the resin matrix somewhat and to provide removable compliant plugs that seal the recesses when such features are not in use. Of course, this solution may not protect these features from moisture exposure when such features are in use.

An alternative solution is to use anti-shorting circuitry to prevent exposure to moisture from causing a short circuit. If such circuitry is used, this may prevent damage regardless of whether or not the features are in use, i.e., connected to an external cable.

Regardless of the solution used to protect such electrical connector ports, the electrical connector ports may, outside of the portion that must remain free of resin matrix in order to facilitate external cable/plug connection, otherwise be encapsulated in the resin matrix to prevent moisture from the electrical connector ports from reaching other functional components within the resin matrix.

In some implementations, the design of the PMD may not include any externally-accessible electrical connector ports at all. For example, such ports are typically required for two reasons: data transmission and power supply. Data transmission may, in many PMDs, be provided using wireless techniques, rendering such ports no longer strictly necessary. Power transmission may also be provided using wireless techniques, e.g., inductive charging systems featuring inductive charging loops coupled with an internal rechargeable battery. Thus, some PMDs may not feature any penetrations into the resin matrix (aside from, in some instances, the possible absence of resin matrix in front of the display portion of the display module) that could reach the power source, the wireless interface, the one or more processors, or the printed circuit board or substrate.

Other functional components may be sealed or partially sealed against intrusion by the liquid resin. For example, display modules are often manufactured such that a slight air gap or expansion gap exists between the cover glass that protects the display elements and the substrate supporting the display elements; this air gap may be sealed around the perimeter of the display portion by a gasket, sealant, or adhesive to prevent dust or other contaminants, including liquids such as a liquid resin, from entering the air space between the cover glass and the substrate.

In some cases, functional components may be provided in a housing that allows for the functional components to change size and/or shape. For example, in a resin-matrix PMD, the battery may be provided in a housing or other structure that provides room for the battery to swell or expand. Many rechargeable batteries may expand or swell when charged as compared to their uncharged states. To prevent stress fractures in the resin matrix from such expansion, a small air gap may be maintained between such functional components and the resin matrix by encasing such functional components in a housing that prevents the liquid matrix from filling the air gap.

In some implementations, the air gap may be filled with some other compressible substance, e.g., porous silicone rubber.

In addition to the latex mold discussed above with respect to FIG. 4, other molding techniques may be used as well. For example, molds may be machined out of a rigid material, similar to how traditional injection molding molds may be produced, rather than cast around a pre-existing part. For rigid molds, it may be desirable to provide compliant inserts to seal against portions of a functional component that are to remain free of resin.

Figure 7A:
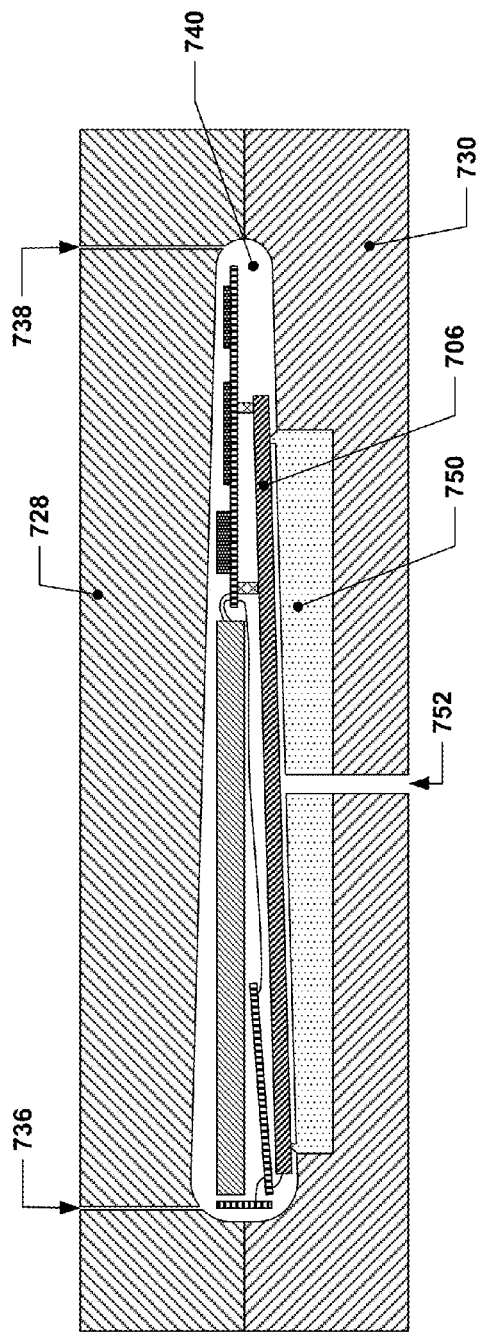
FIGS. 7A and 7B depict simplified sectional side views of some stages of a variant on the technique of FIGS. 6A through 6L'''.
Figure 7B:
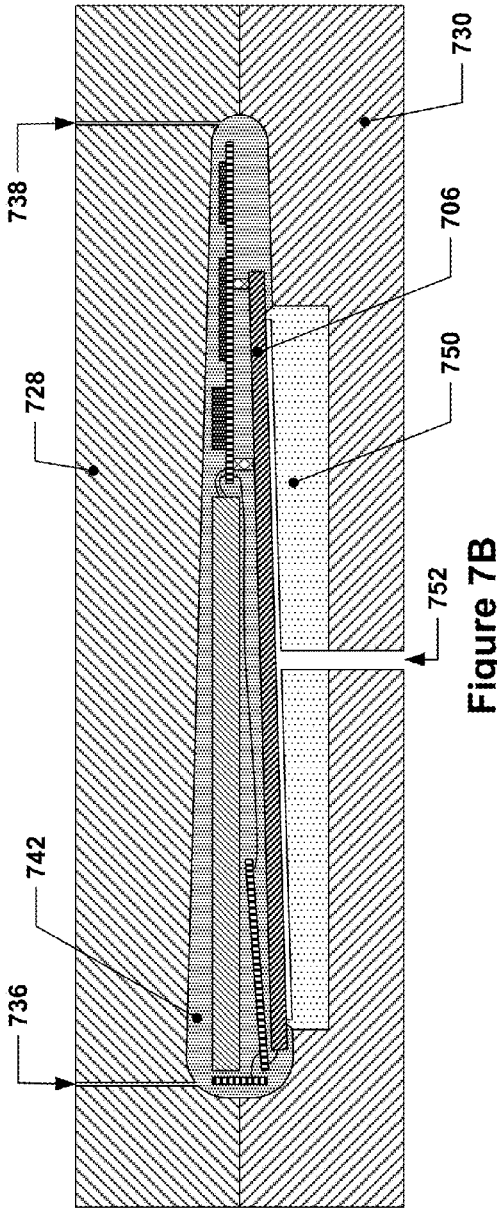

FIGS. 7A and 7B depict cross-section views of a mold similar to that shown in FIGS. 6B through 6K, but with the display portion support surface provided by a vacuum chuck 750 made from a compliant material. The vacuum chuck 750 may have a sealing surface or interface that is configured to act as a dam or barrier against liquid intrusion by the liquid resin into a free volume trapped between, in this case, a display module 706 and the vacuum chuck 750. A vacuum chuck port 752 may be provided to allow a vacuum to be drawn on the free volume; the vacuum may cause the display module to press into the sealing surface to form a liquid-tight seal. If vacuum is also applied to a vacuum port 738 to de-gas the mold cavity, it may be desirable to regulate the vacuum drawn on the vacuum chuck port 752 so that it is at a lower pressure than that provided by the vacuum port 738.

Another variation on the manufacturing technique discussed above may involve temporarily bonding the display module of a device assembly to a support structure and then lowering the device assembly into a cavity that is pre-filled, or filled after the device assembly is lowered, with resin. In some implementations, the support structure may, for example, be part of the top half of a mold. In other implementations, the mold may be an open mold without a top half, and the support structure may simply protrude into the mold via the open portion of the mold. After curing is complete, the display module may be de-bonded from the support structure to release the PMD.

In some implementations, a functional component such as the display module may be pressed into a sealing surface or support surface on the mold by a structure or structures, e.g., tapered pins, that protrude out of an opposing surface of the mold, into the volume that will be filled with liquid resin, and into contact with the functional component. In such implementations, such penetrations into the resin matrix may later be eliminated by filling them with a separate application of resin or by gluing pre-formed inserts into the penetrations.

As discussed previously, the display portion of the display module for a PMD may be kept free of resin matrix to allow for unobstructed viewing. Many PMDs may also include a touch-sensitive portion that overlays much, if not all, of the display portion. Keeping the display portion of the display module free of resin matrix may also facilitate reliable operation of the touch-input technology. For example, while it may be possible in some implementations to utilize a thin layer of optically-clear epoxy resin to form the resin matrix in the display portion of some PMDs without sacrificing significant image quality, such a thin layer may nonetheless interfere with some touch-sensing technologies, e.g., surface capacitance, due the fact that such materials are often electrically-insulating. In other implementations, the touch-sensing technology used may be capable of providing touch-input even despite the presence of a thin layer of resin matrix, e.g., projected capacitance, and PMDs may thus be provided with a thin layer of resin matrix over the display portion. In some implementations, the touch-sensitive portion of the PMD may extend beyond the limits of the display portion, e.g., to provide a trackpad or other input region separate from the display portion. In such implementations, depending on the nature of the touch-sensing technology used, the resin matrix may be kept clear of the touch-sensitive portion as well if the presence of such material would interfere with the touch-sensing technology used. Display modules, as discussed herein, may include a display unit, e.g., a liquid crystal display or e-ink display, and a touch-sensitive technology. In some cases, the display module may be composed of two discrete systems, e.g., a touch-sensitive layer that is overlaid on the display unit (they may even be kept separate up until the point at which the device assembly is assembled), whereas in other instances, the touch-sensing technology may be an integral part of the display module, e.g., received from a display supplier as a single, integrated unit.

Examples of various implementations have been illustrated in the accompanying drawings and described further in the text above. It will be understood that the discussion herein is not intended to limit the claims to the specific implementations described. On the contrary, it is intended to cover alternatives, modifications, and equivalents as may be included within the spirit and scope of the invention as defined by the appended claims. In the preceding description, numerous implementation-specific details have been set forth in order to provide a thorough understanding of the present invention. The present invention may be practiced without some or all of these implementation-specific details. In other instances, well-known process operations have not been described in detail in order not to unnecessarily obscure the present invention.

Any of the above implementations may be used alone or together with one another in any combination. Although various implementations may have been motivated by various deficiencies with the prior art, which may be discussed or alluded to in one or more places in the specification, the implementations do not necessarily address any of these deficiencies. In other words, different implementations may address different deficiencies that may be discussed in the specification. Some implementations may only partially address some deficiencies or just one deficiency that may be discussed in the specification, and some implementations may not address any of these deficiencies.

While various implementations have been described herein, it should be understood that they have been presented by way of example only, and not limitation. Thus, the breadth and scope of the present disclosure should not be limited by any of the implementations described herein, but should be defined only in accordance with the following and later-submitted claims and their equivalents.

It will be understood that unless features in any of the above-described implementations are expressly identified as incompatible with one another or the surrounding context implies that they are mutually exclusive and not readily combinable in a complementary and/or supportive sense, the totality of this disclosure contemplates and envisions that specific features of those implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. A portable multi-media touch-screen tablet, the tablet comprising:
   a touch-screen display module, the touch-screen display module having:
      a display portion substantially corresponding to a region of the touch-screen display module configured to display graphical content;
      a touch-sensitive portion at least partially overlapping the display portion; and
      a remaining portion including edges of the touch-screen display module, an electrical interface for receiving power and display data, and a back surface of the touch-screen display module;

a battery;

at least one transmitter, receiver, antenna, or transceiver configured to transmit and receive data via at least one communications standard selected from the group consisting of 3G, 4G, BLUETOOTH®, 802.11, and WIMAX®;

an inductive charging system electrically coupled with the battery;

one or more processors configured to communicate with the touch-screen display module, the battery, and the wireless interface;

a printed circuit substrate (PCS), the PCS having conductive traces configured to communicate electrical signals among the touch-screen display module, the battery, the wireless interface, and the one or more processors; and a resin matrix, wherein the battery, the wireless interface, the one or more processors, and the remaining portion of the touch-screen display module are fully embedded within the resin matrix, and wherein the resin matrix serves as a substantially conformal overall structural component of the tablet that fixes the touch-screen display module, the battery, the wireless interface, the one or more processors, and the PCS in space relative to each other.

2. The portable multi-media touch-screen tablet of claim 1, wherein the resin matrix extends around a periphery of the display portion and the display portion is substantially free of the resin matrix.

3. The portable multi-media touch-screen tablet of claim 1, wherein the PCS is selected from the group consisting of a printed circuit board and a printed flex circuit.

4. A portable multi-media touch-screen electronic device, the device comprising:

a touch-screen display module, the touch-screen display module having:
   a display portion substantially corresponding to a region of the touch-screen display module configured to display graphical content;
   a touch-sensitive portion at least partially overlapping the display portion; and
   a remaining portion including edges of the touch-screen display module, an electrical interface for receiving power and display data, and a back surface of the touch-screen display module;

a power source;

a wireless interface;

one or more processors configured to communicate with the touch-screen display module, the power source, and the wireless interface;

a printed circuit substrate (PCS), the PCS having conductive traces configured to communicate electrical signals among the touch-screen display module, the power source, the wireless interface, and the one or more processors; and a resin matrix, wherein the power source, the wireless interface, the one or more processors, and the remaining portion of the touch-screen display module are substantially embedded within the resin matrix, and wherein the resin matrix serves as a substantially conformal overall structural component of the device that fixes the touch-screen display module, the power source, the wireless interface, the one or more processors, and the PCS in space relative to each other.

5. The portable multi-media touch-screen electronic device of claim 4, wherein the resin matrix extends around a periphery of the display portion and the display portion is substantially free of the resin matrix.

6. The portable multi-media touch-screen electronic device of claim 4, wherein the PCS is selected from the group consisting of a printed circuit board and a printed flex circuit.

7. The portable multi-media touch-screen electronic device of claim 4, wherein the resin matrix serves as a primary overall structural framework of the device without requiring a separately-manufactured discrete structural frame to secure the touch-screen display, the power source, the wireless interface, the one or more processors, and the PCS with respect to one another.

8. The portable multi-media touch-screen electronic device of claim 4, wherein the resin matrix serves as a primary overall structural framework of the device without requiring a separately-manufactured discrete structural frame that has substantially the same overall footprint as the device and that includes one or more features selected from the group consisting of threaded holes, through-holes, recesses, cutouts, stiffening ribs, and combinations thereof.

9. The portable multi-media touch-screen electronic device of claim 4, wherein the portable multi-media touch-screen electronic device does not include a midframe.

10. The portable multi-media touch-screen electronic device of claim 4, wherein the portable multi-media touch-screen electronic device does not include an outer casing separate from the resin matrix.

11. The portable multi-media touch-screen electronic device of claim 4, the power source having one or more battery cells located within a sealed outer housing, wherein an expansion gap exists between the one or more cells and the sealed outer housing, the expansion gap being free of resin matrix.

12. The portable multi-media touch-screen electronic device of claim 4, further comprising:
one or more electrical connector ports located along a periphery of the resin matrix and electrically connected with one or more of the power source, the wireless interface, the one or more processors, and the remaining portion of the touch-screen display, the one or more electrical connector ports being configured to resist ingress of moisture to an interior of the portable multi-media touch-screen electronic device.

13. The portable multi-media touch-screen electronic device of claim 4, further comprising:
one or more electrical connector ports located along a periphery of the resin matrix and electrically connected with one or more of the power source, the wireless interface, the one or more processors, and the remaining portion of the touch-screen display, the one or more electrical connector ports protected against electrical interference from moisture exposure through the use of anti-shorting circuitry.

14. The portable multi-media touch-screen electronic device of claim 4, further comprising:
an inductive charging system electrically configured to charge the power source, the inductive charging system also fully embedded within the resin matrix, wherein the resin matrix does not have any penetrations into the resin matrix that reach the power source, the wireless interface, the one or more processors, the PCS, and the remaining portion.

* * * * *